(12) United States Patent
Hoffman et al.

(10) Patent No.: US 7,382,421 B2
(45) Date of Patent: Jun. 3, 2008

(54) THIN FILM TRANSISTOR WITH A PASSIVATION LAYER

(75) Inventors: Randy Hoffman, Corvallis, OR (US); John Wager, Corvallis, OR (US); David Hong, Eugene, OR (US); Hai Chiang, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 242 days.

(21) Appl. No.: 10/964,062

(22) Filed: Oct. 12, 2004

(65) Prior Publication Data

US 2006/0079034 A1 Apr. 13, 2006

(51) Int. Cl.
*G02F 1/1343* (2006.01)
*G02F 1/136* (2006.01)

(52) U.S. Cl. ............................ 349/43; 349/38; 257/412
(58) Field of Classification Search .................. 349/38, 349/43; 257/412
See application file for complete search history.

(56) References Cited

U.S. PATENT DOCUMENTS

| | | | |
|---|---|---|---|
| 4,704,783 A | 11/1987 | Possin et al. | |
| 4,866,003 A | 9/1989 | Yokoi et al. | |
| 4,943,837 A | 7/1990 | Konishi et al. | |
| 5,384,271 A | 1/1995 | Kwasnick et al. | |
| 5,414,283 A | 5/1995 | den Boer et al. | |
| 5,455,182 A | 10/1995 | Nishimoto et al. | |
| 5,561,319 A | 10/1996 | Owens et al. | |
| 5,658,823 A | 8/1997 | Yang | |
| 6,144,082 A * | 11/2000 | Yamazaki et al. | 257/412 |
| 6,236,064 B1 * | 5/2001 | Mase et al. | 257/72 |
| 6,271,540 B1 | 8/2001 | Miyamoto et al. | |
| 6,436,742 B2 | 8/2002 | Miyamoto et al. | |
| 6,566,174 B1 | 5/2003 | Takechi | |
| 6,855,954 B1 | 2/2005 | Zhang | |
| 7,119,857 B1 * | 10/2006 | Nakamura et al. | 349/38 |
| 2001/0005596 A1 | 6/2001 | Lee et al. | |
| 2002/0008797 A1 * | 1/2002 | Yamazaki et al. | 349/43 |
| 2002/0126233 A1 * | 9/2002 | Yamagishi et al. | 349/43 |
| 2003/0047785 A1 | 3/2003 | Kawasaki et al. | |
| 2003/0223019 A1 * | 12/2003 | Kim et al. | 349/43 |

FOREIGN PATENT DOCUMENTS

JP 2001 119029 4/2001

OTHER PUBLICATIONS

Hoffman; "ZnO-based transparent thin-film transistors"; Applied Physics Letters, vol. 82, No. 5, Feb. 3, 2003, pp. 733-735.

* cited by examiner

*Primary Examiner*—Huyen Ngo

(57) ABSTRACT

Apparatus comprising a thin film transistor having passivation layer disposed adjacent to a second surface of said channel layer, wherein said passivation layer comprises one or more wide-bandgap dielectric materials.

26 Claims, 3 Drawing Sheets

THIN FILM TRANSISTOR WITH A PASSIVATION LAYER

BACKGROUND

Electronic devices, such as integrated circuits, solar cells, and/or electronic displays, for example, may be comprised of one or more electrical components, such as one or more thin film transistors. Thin film transistors may be formed from one or more layers, which may be stacked, for example. In at least one type of electronic device, multiple thin film transistors may be coupled to form circuitry, such as a circuitry comprising a plurality of thin film transistors. When forming circuitry such as this, varying techniques may be utilized to isolate, separate and/or insulate one or more transistors and/or layers from one another, for example. Although particular techniques may vary, one or more techniques may have particular disadvantages. For example, such techniques may be time-consuming and/or expensive, may not allow for the use of particular materials, and/or may not produce the desired results.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

DETAILED DESCRIPTION

Figure 1:
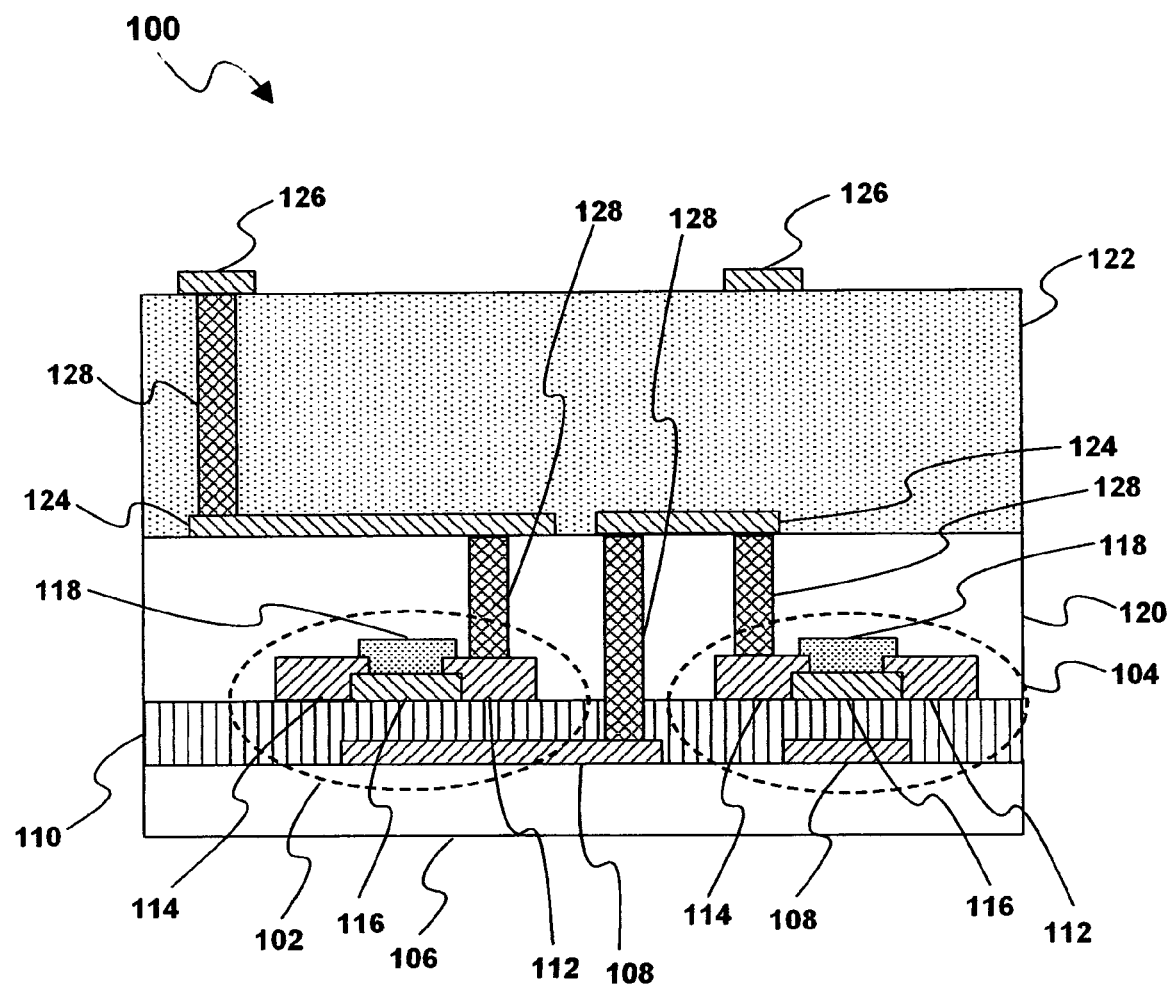
FIG. 1 is a cross-sectional cutaway view of one embodiment of a device having a passivation layer.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and/or dielectric devices, for example, may be comprised of one or more electronic components. One or more of these electronic components may be comprised of one or more thin films, such as a plurality of thin films, which may additionally be referred to as layers. In this context, the term thin film refers to a material formed to a thickness, such that surface properties of the material may be observed, and these properties may vary from bulk material properties. Additionally, although referred to as layers, it is desirable to note that layers of one or more of the aforementioned devices may comprise continuous and/or non-continuous layers, and may comprise one or more portions of a thin film device, such as a substrate, a dielectric layer and/or one or more electrodes, for example. These one or more layers may be further comprised of one or more materials, and the one or more materials may have electrical and/or chemical properties, such as conductivity, passivation, insulative and/or mobility properties, for example. The one or more material layers, in combination with one or more other material layers, may form one or more electronic components, such as thin film transistors (TFT), capacitors, diodes, resistors, photovoltaic cells, insulators, conductors, optically active devices, or the like. These one or more components may be combined with one or more other components to form circuitry, such as circuitry at least partially comprising a plurality of thin film devices, for example. In one embodiment, the circuitry may comprise at least a portion of an electronic device, for example. Components such as TFTs, in particular, may, for example, be utilized in display devices including, for example, an electroluminescent and/or a liquid crystal display (LCD). Thus, one or more material layers, such as thin film layers, may form one or more thin film transistors, which may form a portion of an electronic device, such as a display device, for example.

At least as part of the fabrication process of electronic devices, such as a device incorporating one or more thin film transistors, one or more electrodes may be formed at least as part of one or more of the material layers. In at least one embodiment, one or more gate, drain and/or source electrodes may be formed as part of one or more material layers, and may be formed on at least a portion of one or more additional material layers, such as a substrate layer and/or dielectric layer, for example. One or more additional material layers may be formed, including one or more additional dielectric layers, one or more channel layers, and/or one or more passivation layers, for example. Additionally, one or more electrodes may be coupled to one or more other electrodes and/or layers, such as electrically by use of an interconnect formed at least partially in a via, for example. Additionally, one or more layers, such as one or more electrodes, may be coupled to one or more other components, such as one or more additional thin film transistors to form circuitry, and may comprise at least a portion of an electronic device, such as an electronic display, for example.

In one particular embodiment, a passivation layer may comprise at least a portion of an electronic component such as a thin film transistor. A passivation layer, in at least one embodiment, may comprise a layer of one or more materials that may provide passivation properties, such as physical, chemical and/or electrical insulation, isolation, stability and/or separation between two or more other layers of a component and/or between multiple components, such as multiple thin film devices, for example. In one particular embodiment, although claimed subject matter is not so limited, a passivation layer may provide physical, chemical and/or electrical insulation, isolation, stability and/or separation between a portion of a first thin film transistor and one or more portions of a second thin film transistor, such as a second thin film transistor stacked above the first thin film transistor, for example. A passivation layer formed in this manner may at least partially allow for the formation of other components such as thin film transistors adjacent to other components, and/or interconnect layers adjacent to one or more thin film transistors, such as by reducing and/or eliminating electrical and/or chemical effects of having components formed adjacent to one another. For example, effects including current leakage, parasitic capacitance, gas adsorption, oxidation, degradation of conductivity, degradation of mobility, device instability (e.g., threshold voltage shift), chemical reactions, interdiffusion and/or impurity penetration, as just a few examples. One or more of these effects may cause components to operate less than optimally, such as when formed proximate to other components and/or interconnects, for example.

Referring now to FIG. 1, there is illustrated a cross-sectional cutaway view of one embodiment 100 of a device having a passivation layer. Embodiment 100, here, comprises components 102 and 104, which may comprise thin film transistors, for example. Components 102 and 104 may be comprised of one or more materials and/or layers, and one or more additional layers may be formed on or over at least a portion of components 102 and 104, such as one or more dielectric layers and/or interconnects, for example, which may provide interconnection between components 102 and 104, and/or to one or more other components formed on the same layer or on or over subsequent layers, for example (not shown). In this embodiment, components 102 and 104 are formed on or over a substrate 106. Formed on or over substrate 106 is gate dielectric layer 110, and one or more electrodes, such as gate electrode 108. Formed on or over at least a portion of the gate dielectric layer 110 are additional electrodes, such as source electrode 114 and drain electrode 112. Additionally, a channel layer 116 is formed on or over at least a portion of gate dielectric layer 110. A channel passivation layer 118 is formed on or over at least a portion of the channel layer 116. In this embodiment, channel passivation layer 118 is formed on or over a first surface of the channel layer 116, and the gate dielectric layer 110 is formed on a substantially opposing second surface of the channel layer 116, for example. However, claimed subject matter is not so limited, as will be explained in more detail later. An interlevel dielectric layer 120 is formed on or over at least a portion of one or more of the aforementioned layers and/or components. In this embodiment, another interlevel dielectric layer 122 is formed on or over at least a portion of interlevel dielectric layer 120, and, in this embodiment, may provide the capability to include an additional interconnect layer 126, such as by providing electrical and/or physical separation, but, in alternative embodiments, interlevel dielectric layer 122 may be included so as to allow the use of an additional layer comprising one or more additional thin film devices, for example. In this context, an interlevel dielectric layer may comprise a layer of one or more materials that may have dielectric properties, and may be formed such that other material layers may be at least partially physically and/or electrically separated from one another, such as one or more interconnect layers and/or thin film device layers, for example. However, continuing with this embodiment, one or more of the aforementioned layers and/or components may be coupled, such as electrically, by use of one or more interconnects 124 and/or 126, and/or vias 128, such as by electrically coupling gate electrode 108 to gate dielectric layer 110, and/or electrically coupling drain and source electrodes 112 and 114 to channel layer 116, for example, although it is desirable to note that claimed subject matter is not so limited to the electrical coupling of the described components and/or layers. Additionally, it is noted, here and throughout this description that claimed subject matter is not limited to the foregoing layers and/or components being formed as illustrated in FIG. 1. For example, other layers may be included, such as between various layers, so that layers may be formed above one another rather than on one another, depending, for example, on the particular embodiment. In at least one embodiment, the portion of an electronic device 100 may comprise a portion of a display device, such as a portion of a backplane of an active-matrix liquid crystal display (AMLCD) device, or a portion of a smart package, as just a few examples. Additionally, in this embodiment, the particular configuration of components 102 and 104 may be referred to as a bottom-gate configuration, meaning, in this context, that the gate electrode 108 is configured beneath the gate dielectric 110, i.e., configured on the surface of the gate dielectric layer 110 closest to the substrate 106. However, it is desirable to note that claimed subject matter is not limited to this configuration. For example, particular embodiments of claimed subject matter may also be utilized in a thin film transistor in other configurations, such as a top-gate configuration, in which the gate electrode 108 is configured above the gate dielectric 110, i.e., configured on or over the surface of the gate dielectric layer 110 furthest from the substrate 106, for example.

Although claimed subject matter is not limited to any particular material and/or combination of materials to form one or more of the layers and/or components illustrated in FIG. 1, in at least one embodiment, substrate 106 may comprise a substrate of glass, plastic, and/or metal, as just a few examples, and may additionally comprise any combination of materials including silicon, silicon dioxide, one or more organic substrate materials, such as polyimide (PI), including Kapton®, polyethylene terephthalate (PET), polyethersulfone (PES), acrylic, polycarbonate (PC), and/or polyethylenenaphthalate (PEN), but it is desirable to note that claimed subject matter is not limited in this respect, and may comprise any material suitable for use as a substrate, such as any material exhibiting properties suitable for application as a substrate in an electronic device, for example. Gate dielectric layer 110 may comprise a layer substantially comprising dielectric material, and may comprise organic and/or inorganic material, for example. In at least one embodiment, gate 108 may comprise zirconium oxide, titanium oxide, tantalum oxide, yttrium oxide, lanthanum oxide, silicon oxide, aluminum oxide, hafnium oxide, barium zirconate titanate, barium strontium titanate, silicon nitride, and/or silicon oxynitride, as just a few examples. Additionally, electrodes 108, 112 and/or 114 may be comprised of one or more types of materials, such as indium tin oxide; other doped oxide semiconductors such as n-type doped zinc oxide, indium oxide, or tin oxide, and/or metals such as Al, Ag, In, Sn, Zn, Ti, Mo, Au, Pd, Pt, Cu, W, and/or Ni, as just a few examples.

Continuing with this embodiment, channel layer 116 may be comprised of one or more semiconductive materials, including, for example, oxide semiconductors, such as zinc oxide, cadmium oxide, indium oxide, gallium oxide, tin oxide, silver oxide, copper oxide, germanium oxide, lead oxide and/or antimony oxide, and/or oxides having two or more cations, such as two or more cations selected from among the aforementioned binary oxides, for example. Additionally, channel passivation layer 118 may be comprised of one or more materials capable of providing passivation of one or more of the layers described, for example. In one embodiment, channel passivation layer may comprise a dielectric material, such as a wide-bandgap dielectric material, for example, including oxides and/or nitrides of the following materials: silicon, germanium, aluminum, gallium, zirconium, tantalum, such as $SiO_x$, $SiN_x$, $SiO_xN_y$, $GeO_x$, $AlO_x$, $GaO_x$, $SbO_x$, $ZrO_x$, $HfO_x$, $TaO_x$; also including materials such as $SiO_xC_y$, $YO_x$, $VO_x$, $MgO_x$, $MgF_x$, $CaO_x$, $CaF_x$, $BaO_x$, $BaF_x$, $SrO_x$, and/or $SrF_x$, for example. However, claimed subject matter is not limited in this respect. Wide-bandgap dielectric materials, in this context, may comprise materials that exhibit properties that may be desirable, including on-resistance, efficiency, thermal stability, and/or reliability, as compared to silicon based materials, as just an example, although, again, claimed subject matter is not so limited.

Additionally, interlevel dielectric layers 120 and/or 122 may be comprised of one or more dielectric materials, such as silicon oxides, nitrides, or oxynitrides; aluminum oxides; spin-on glasses; and various other inorganic or organic low-k dielectric materials such as polyimide, for example. In one particular embodiment, interlevel dielectric layer may be comprised of substantially the same material or combination of materials as channel passivation layer 118, for example, and, in this embodiment, may be formed from a single process, for example, explained in more detail later. Interlevel dielectric layer 122 may additionally be comprised of one or more dielectric materials, such as one or more of the aforementioned materials, for example. Interconnects 124, 126 and/or vias 128 may be comprised of one or more materials, such as indium tin oxide, or metals such as Al, Ag, In, Sn, Zn, Ti, Mo, Au, Pd, Pt, Cu, Ni, although, again, claimed subject matter is not limited in this respect. For example, in one exemplary embodiment, a thin film transistor, such as a thin film transistor 102, for example, may be formed on or over a substrate of silicon, and may be formed to have a gate electrode substantially comprising doped silicon, for example. The thin film transistor may further comprise a gate dielectric layer formed on or over at least a portion of the substrate, and substantially comprising silicon dioxide, and formed to a thickness of approximately 100 nanometers (nm), and may additionally comprise a channel formed on or over at least a portion of the gate dielectric layer, wherein the channel may be comprised of zinc tin oxide, and may be formed to a thickness of approximately 80 nm, for example. One or more source and drain electrodes may be formed on or over at least a portion of the gate dielectric layer, and may be substantially comprised of indium tin oxide, and may be formed to a thickness within the range of approximately 300 nm. A passivation layer may be formed on or over at least a portion of the channel, for example, and may comprise a layer of silicon dioxide, formed to a thickness of approximately 100 nm, for example. One or more of the materials may be deposited by use of one or more deposition methods, such as thermal oxidation, sputtering, and/or thermal evaporation, for example. Of course, this is just one exemplary embodiment, and claimed subject matter is not limited in this respect. In this exemplary embodiment, the formed thin film transistor may have particular performance characteristics, and may display particular properties. For example, in this embodiment, the thin film transistor may, in operation, have demonstrate a field effect mobility within the range of approximately 25-30 $cm^2N$ s, and may have a turn-on or threshold voltage within the range of 0-5 V, as just an example. In this embodiment, this thin film transistor may demonstrate acceptable performance characteristics and may have similar performance characteristics of a thin film device not having a passivation layer, for example.

Formation of one or more layers of device 100 may comprise one or more processes, and/or numerous process operations, but claimed subject matter is not limited to any particular method of formation of one or more layers and/or components of device 100. Additionally, particular processes may depend at least in part on the particular materials utilized to form one or more portions of device 100. However, in at least one embodiment, one or more deposition and/or forming processes, such as one or more thermal evaporation, electron-beam evaporation, sputter deposition, screen printing, chemical vapor deposition (CVD), atomic layer deposition (ALD), pulsed laser deposition (PLD), electroplating, electroless plating, inkjet printing, and/or spin coating deposition processes may be utilized, and/or one or more patterning processes, for example, but again, claimed subject matter is not so limited. Particular methods of formation of the devices illustrated herein may be better understood when explained with reference to FIG. 2, below. Additionally, depending at least in part on the one or more materials utilized to form a device and/or the particular processes utilized, one or more post-deposition processes, such as one or more thermal, chemical and/or photochemical treatments may be utilized in the formation process, such as one or more annealing processes and/or ultraviolet (UV) curing processes, for example, although, again, claimed subject matter is not so limited. Although claimed subject matter is not so limited, in one particular embodiment, an electronic device, such as device 100, may be formed by use of one or more processes that may reduce and/or eliminate the use of one or more post-deposition processes, for example. In this embodiment, one or more evaporation and/or low power sputtering processes may be utilized, and this may result in a reduced and/or eliminated need for post-deposition processes such as thermal treatment, in at least one embodiment.

The device illustrated in FIG. 1 may be formed by use of a computer controlled formation system (not shown), which may be capable of providing material and/or post-deposition processing to at least a portion of one or more portions of device 100, such as one or more portions illustrated in FIG. 1. A formation system used to form one or more of the illustrated devices may, for example, comprise a deposition device (not shown), capable of disposing material on or over one or more layers. In at least one embodiment, a deposition device may comprise an ejection device, which may comprise a jetting device, and may be configured to apply material, such as conductive, nonconductive and/or dielectric material to locations on or over a device, such as to form one or more portions of device 100, for example. Additionally, a formation system may comprise a post-deposition processing device, such as a laser capable of generating a laser beam at a frequency in the electromagnetic spectrum and having suitable energy to provide intense localized or "spot" heating, for example (not shown), although this is just one example, and claimed subject matter is not limited in this respect.

Figure 2:
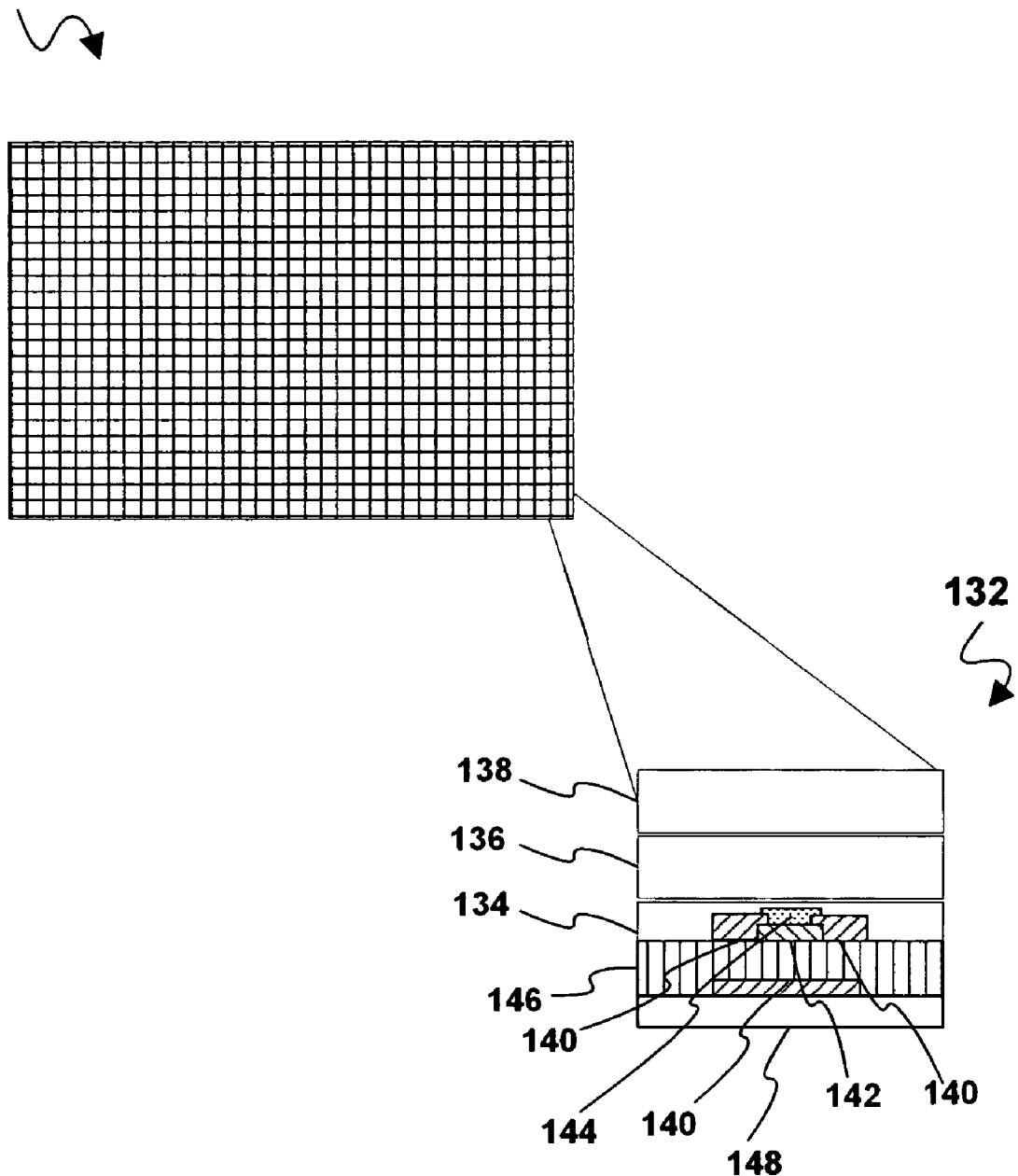
FIG. 2 is another embodiment of a device having a passivation layer.

Referring now to FIG. 2, there is illustrated an embodiment of an electronic device, which may comprise one or more components, such as one or more of the components illustrated in FIG. 1, for example. Illustrated in FIG. 2 is device 130, which may comprise a portion of an LCD device, such as an AMLCD device, for example. Device 130 may be comprised of a plurality of display components 132, which may be further comprised of a plurality of components, such as thin film transistors, pixels and/or interconnects, for example. In this embodiment, display component 132 may be comprised of a thin film transistor 134, an interconnect layer 136, and a pixel layer 138, for example. Thin film transistor 134, in this embodiment, may comprise a plurality of electrodes 140, a channel layer 142, a dielectric layer 146, a substrate 148, and a passivation layer 144, for example, which may provide passivation between thin film transistor 134 and one or more other components, such as interconnect layer 136 and/or pixel layer 138, for example. One or more of the aforementioned components may be comprised of one or more materials, and may be formed by one or more processes, but claimed subject matter is not limited in this respect. For example, one or more of the foregoing components may be formed from one or more of the materials and/or processes described in reference to FIG. 1, although, again, claimed subject matter is not so limited.

Figure 3:
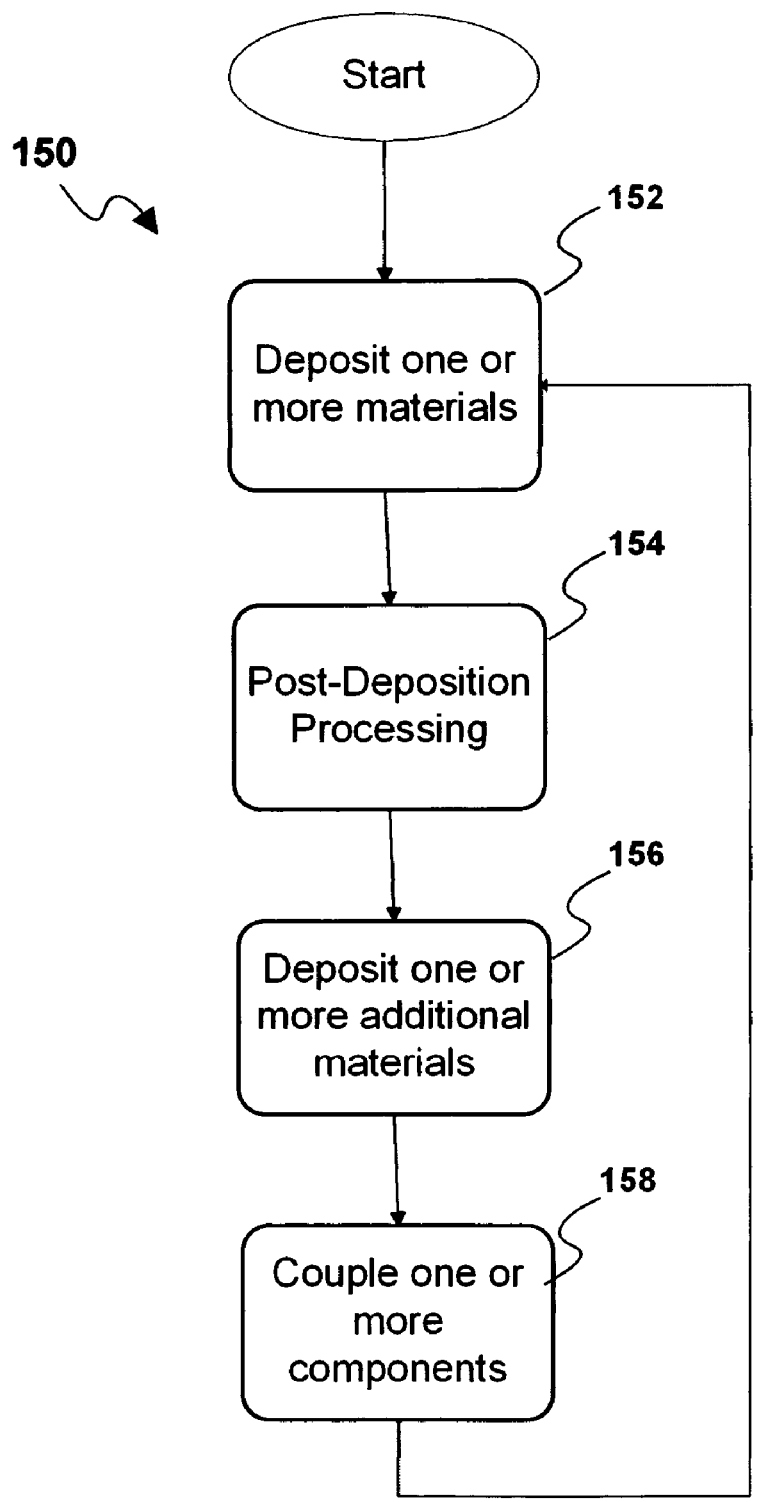
FIG. 3 is a flowchart illustrating one embodiment of a method to form a passivation layer.

Referring now to FIG. 3, one embodiment of a technique for forming an electronic device comprising at least one passivation layer is illustrated by a flowchart, although, of course, claimed subject matter is not limited in scope in this respect. Such an embodiment may be employed to at least partially form a device, wherein the device comprises at least one component and the at least one component comprises at least one passivation layer, as described below. The flowchart illustrated in FIG. 3 may be used to form at least a portion of a device, such as device 100 of FIG. 1 and/or device 130 of FIG. 2, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter.

Flowchart 150 depicted in FIG. 3 may, in alternative embodiments, be at least partially implemented in hardware and software and/or firmware, such as the aforementioned computer controlled formation system, for example, and may comprise discrete and/or continual operations. In this embodiment, at block 152, one or more materials may be disposed on or over at least a portion of a component, such as to form one or more layers, such as one or more layers illustrated as part of device 100 of FIG. 1 and/or device 130 of FIG. 2, for example. At block 154, a post-deposition process, such as a thermal treating operation may be performed on at least a portion of one or more layers, such as the layer formed at block 152, for example, although in alternative embodiments, no post-deposition processes may be performed, for example. At block 156, one or more additional materials may be disposed, such as to form one or more additional layers of a component, and/or one or more layers of additional components, such as one or more layers of device 100, for example. In at least one embodiment, one or more of the aforementioned operations may be repeated, such as in a substantially continuous manner, for example, until one or more components are substantially formed. At block 158, one or more components may be coupled, such as to form a device, such as a portion of a device such as device 100, for example. One or more of the aforementioned operations may be repeated, such as to form additional components, such as one or more additional thin film devices and/or circuitry comprising a plurality of thin film devices is substantially formed, for example.

An at least partially formed electronic device, such as a device comprising one or more thin film transistors, in at least one embodiment, may be formed from one or more of the aforementioned operations, but claimed subject matter is not limited to any particular method of formation of one or more layers of one or more thin film transistors. However, in one embodiment, a substrate, such as a substrate of glass and/or plastic, for example, may be provided, and one or more deposition processes, such as one or more thermal evaporation, electron-beam evaporation, sputter deposition, chemical vapor deposition (CVD), atomic layer deposition (ALD), electro-plating, electroless plating, inkjet printing, screen printing, and/or spin coating deposition processes may be utilized to form one or more material layers, such as one or more layers illustrated in FIG. 1, for example. One or more of these processes may be repeated, such as to form one or more additional material layers, for example, resulting in the formation of a component, such as a thin film transistor, in at least one embodiment. Additionally, one or more of these processes may be utilized to couple one or more components, such as two or more thin film transistors, which may result in the formation of at least a portion of an electronic device, for example. However, claimed subject matter is not limited to any particular method or combination of methods to form a device having at least one passivation layer, for example.

At block 152, depositing one or more materials may comprise selectively applying one or more materials on or over one or more portions of one or more material layers, such as a substrate, for example. In at least one embodiment, one or more conductive, nonconductive and/or dielectric materials may be applied on or over at least a portion of a layer, for example, resulting in the formation of at least a portion of one or more material layers, in at least one embodiment. In this embodiment, one or more portions of a component may be formed, such as one or more electrodes, dielectric layers, channels, and/or interconnects, for example. Although numerous differing devices and/or operations may be utilized to deposit one or more materials, in at least one embodiment, one or more thermal evaporation operations may be utilized to form one or more layers. Alternatively, one or more electron-beam evaporation, sputter deposition, chemical vapor deposition (CVD), atomic layer deposition (ALD), electro-plating, electroless plating, inkjet printing, screen printing, and/or spin coating deposition operations may be utilized to form one or more material layers. For example, in at least one embodiment, a passivation layer may be formed on or over at least a portion of a thin film device, such as illustrated in FIGS. 1 and/or 2. In this embodiment, a passivation layer may be formed from one or more of the aforementioned deposition processes, and may be formed from one or more materials that may be capable of at least partially providing passivation capabilities, such as described in reference to FIGS. 1 and/or 2, for example.

At block 154, one or more post-deposition processes may be performed on one or more portions of one or more layers, such as to at least a portion of the one or more materials deposited at block 152, for example. Although numerous types and/or methods of post-deposition processing exist, including thermal, chemical and/or photochemical processes, and claimed subject matter is not so limited, in one embodiment, one or more annealing operations may be performed. In one embodiment, one or more lasers may be utilized to apply electromagnetic radiation to the one or more materials applied at block 152, which may result in at least a portion of the material being altered, such as physically and/or chemically, such as by annealing, for example. Alternatively, no post-deposition processes may be performed, and, again, utilization of one or more post-deposition processes may depend at least in part on the one or more materials being deposited, and/or the particular device being formed, for example. For example, in one embodiment, wherein a material substantially comprising silicon oxide may be deposited by one or more deposition processes, such as by CVD, for example. In this embodiment, a laser device may apply electromagnetic radiation to at least a portion of the deposited material, such as to elevate the temperature of at least a portion of the material at least to a temperature wherein at least a portion of the material and/or an interface between the material and the material of a second, or adjacent, material layer may be modified, for example. However, claimed subject matter is not so limited, as stated previously. Conversely, if a material or combination of materials are deposited by one or more deposition processes such as evaporation and/or low power sputtering, one or more post-deposition processes may not be performed, for example.

At block 156, depositing one or more materials may comprise selectively depositing one or more materials on or over one or more portions of one or more material layers, such as on or over at least a portion of the one or more material deposited at block 152, for example. In at least one embodiment, one or more conductive, nonconductive and/or dielectric materials may be applied on or over at least a portion of a layer, for example, resulting in the formation of at least a portion of one or more material layers, in at least one embodiment. In this embodiment, one or more portions of a component may be formed, such as one or more electrodes, dielectric layers, channels, and or interconnects, for example. Although numerous differing devices and/or operations may be utilized to deposit one or more materials, in at least one embodiment, one or more thermal evaporation operations may be utilized to form one or more layers. Alternatively, one or more electron-beam evaporation, sputter deposition, chemical vapor deposition (CVD), atomic layer deposition (ALD), electro-plating, electroless plating, inkjet printing, screen printing, and/or spin coating deposition operations may be utilized to form one or more material layers. For example, wherein a passivation layer may be substantially formed at block 152, a material layer substantially comprising a dielectric layer may be formed, such as dielectric layers 120 and/or 122 of FIG. 1. In one embodiment, wherein a passivation layer may be formed at block 152, and wherein the passivation layer is formed adjacent to a dielectric layer comprising substantially the same material as the passivation layer, at block 152 the passivation layer and dielectric layer may be substantially formed from a single deposition operation, for example. In this embodiment, at block 156, after formation of the passivation layer and first dielectric layer from a single deposition operation, a second dielectric layer may be formed on or over at least a portion of the first dielectric layer, similarly to dielectric layer 122 of FIG. 1, for example. However, claimed subject matter is not limited in this respect.

At block 158, one or more components formed by use of one or more of the foregoing operations may be coupled, such as electrically by use of one or more interconnects and/or vias, for example, such as interconnects 124 and/or 126, and/or vias 128 as illustrated in FIG. 1, for example. In one embodiment, circuitry may be formed, wherein the circuitry comprises one or more components comprised of one or more material layers, for example. In this embodiment, for example, circuitry substantially comprising an electronic device, such as an LCD device backplane or a smart package, for example, may be formed by use of one or more of the aforementioned operations, for example, such as device 130 of FIG. 2, however, claimed subject matter is not so limited.

It is, of course, now appreciated, based at least in part on the foregoing disclosure, that a combination of hardware and software and/or firmware may be produced capable of performing a variety of operations, including one or more of the foregoing operations, which may be implemented in a system suitable for forming a device having a passivation layer, as described previously. It will additionally be understood that, although particular embodiments have just been described, claimed subject matter is not limited in scope to a particular embodiment or implementation. For example, a system capable of implementing one or more of the foregoing operations described in reference to FIG. 3 may comprise hardware, such as implemented to operate on a device or combination of devices as previously described, for example, whereas another embodiment may be in software and hardware, for example. Likewise, an embodiment of a system capable of implementing one or more of the abovementioned operations may be implemented in firmware, or as any combination of hardware, software, and/or firmware, for example. Additionally, all or a portion of one embodiment may be implemented to operate at least partially in one device, such as an ejection device, a laser device, a display, a computing device, a set top box, a cell phone, and/or a personal digital assistant (PDA), for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, a set top box, a cell phone, and/or a personal digital assistant (PDA), and/or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. An apparatus, comprising:
   at least one thin film transistor (TFT) having:
   a substrate;
   a channel layer disposed over at least a portion of the substrate, wherein said channel layer comprises a semiconductive oxide, and wherein said channel layer comprises at least a first surface and a substantially opposing second surface;
   a gate dielectric layer disposed adjacent to said first surface of said channel layer;
   a passivation layer disposed adjacent to said second surface of said channel layer, wherein said passivation layer comprises one or more wide-bandgap dielectric materials.

2. The apparatus of claim 1, and further comprising:
   one or more gate electrodes formed over at least a portion of said substrate, wherein the gate electrode is electrically coupled to said gate dielectric layer; and one or more drain and source electrodes formed over at least a portion of said substrate, wherein said drain and source electrodes are electrically coupled to said channel layer.

3. The apparatus of claim 2, wherein said TFT comprises a bottom gate TFT.

4. The apparatus of claim 1, wherein said at least one TFT comprises a plurality of thin film transistors, wherein at least a portion of said thin film transistors are coupled to form circuitry.

5. The apparatus of claim 4, wherein said circuitry substantially comprises at least a portion of a display device.

6. The apparatus of claim 5, wherein said at least a portion of a display device comprises a backplane of an Active Matrix Liquid Crystal Display (AMLCD) device.

7. The apparatus of claim 4, wherein said circuitry substantially comprises at least a portion of a smart package.

8. The apparatus of claim 1, wherein said channel layer comprises one or more of: zinc oxide, cadmium oxide, indium oxide, gallium oxide, tin oxide, silver oxide, copper oxide, germanium oxide, lead oxide and/or antimony oxide.

9. The apparatus of claim 1, wherein said channel layer is substantially comprised of an oxide comprising two or more of: zinc, cadmium, indium, gallium, tin, silver, copper, germanium, lead and/or antimony.

10. The apparatus of claim 1, wherein said gate dielectric layer comprises one or more of: zirconium oxide, tantalum oxide, yttrium oxide, lanthanum oxide, silicon oxide, aluminum oxide, hafnium oxide, barium zirconate titanate, barium strontium titanate, silicon nitride, and/or silicon oxynitride.

11. The apparatus of claim 1, wherein said passivation layer comprises one or more of: $SiO_x$, $SiN_x$, $SiO_xN_y$, $SiO_xC_y$, $SiO_xC_yH_z$, $SiO_xF_y$, $GeO_x$, $AlO_x$, $GaO_x$, $SbO_x$, $ZrO_x$, $HfO_x$, $TaO_x$, $YO_x$, $VO_x$, $MgO_x$, $MgF_x$, $CaO_x$, $CaF_x$, $BaO_x$, $BaF_x$, $SrO_x$, $SrF_x$, and/or one or more types of spin-on glass.

12. The apparatus of claim 1, wherein said passivation layer substantially comprises at least a portion of an interlevel dielectric layer.

13. The apparatus of claim 1, wherein said substrate comprises one or more of: glass, silicon, silicon dioxide, and/or one or more organic substrate materials, including polyimides (PI), polyethylene terephthalates (PET), polyethersulfones (PES), polycarbonates (PC), polyethylenenaphthalates (PEN), and/or acrylics.

14. An apparatus, comprising:
a means for forming a thin film transistor (TFT) having;
a substrate;
a channel layer disposed over at least a portion of the substrate, wherein said channel layer comprises a semiconductive oxide, and wherein said channel layer comprises at least a first surface and a substantially opposing second surface;
a gate dielectric layer disposed adjacent to said first surface of said channel layer;
means for passivating, wherein said means for passivating comprises a passivation layer disposed adjacent to said second surface of said channel layer, wherein said passivation layer comprises one or more wide-bandgap dielectric materials.

15. The apparatus of claim 14, and further comprising:
means for forming one or more gate electrodes over at least a portion of said substrate, wherein the gate electrode is electrically coupled to said gate dielectric layer; and
means for forming one or more drain and source electrodes over at least a portion of said substrate, wherein said drain and source electrodes are electrically coupled to said channel layer.

16. The apparatus of claim 15, wherein said TFT comprises a bottom gate TFT.

17. The apparatus of claim 15, wherein said apparatus comprises a plurality of thin film transistors, wherein at least a portion of said thin film transistors are coupled to form circuitry.

18. The apparatus of claim 15, wherein said circuitry substantially comprises at least a portion of a display device.

19. The apparatus of claim 18, wherein said at least a portion of a display device comprises a backplane of an Active Matrix Liquid Crystal Display (AMLCD) device.

20. The apparatus of claim 15, wherein said at least one circuit substantially comprises at least a portion of a smart package.

21. The apparatus of claim 15, wherein said channel layer substantially comprises one or more of: zinc oxide, cadmium oxide, indium oxide, gallium oxide, tin oxide, silver oxide, copper oxide, germanium oxide, lead oxide and/or antimony oxide.

22. The apparatus of claim 15, wherein said channel layer substantially comprises an oxide comprising two or more of: zinc, cadmium, indium, gallium, tin, silver, copper, germanium, lead and/or antimony.

23. The apparatus of claim 15, wherein said gate dielectric layer substantially comprises one or more of: zirconium oxide, tantalum oxide, yttrium oxide, lanthanum oxide, silicon oxide, aluminum oxide, hafnium oxide, barium zirconate titanate, barium strontium titanate, silicon nitride, and/or silicon oxynitride.

24. The apparatus of claim 15, wherein said means for passivating substantially comprises a layer of one or more of: $SiO_x$, $SiN_x$, $SiO_xN_y$, $SiO_xC_y$, $SiO_xC_yH_z$, $SiO_xF_y$, $GeO_x$, $AlO_x$, $GaO_x$, $SbO_x$, $ZrO_x$, $HfO_x$, $TaO_x$, $YO_x$, $VO_x$, $MgO_x$, $MgF_x$, $CaO_x$, $CaF_x$, $BaO_x$, $BaF_x$, $SrO_x$, $SrF_x$, and/or one or more types of spin-on glass.

25. The apparatus of claim 15, wherein said means for passivating substantially comprises at least a portion of an interlevel dielectric layer.

26. The apparatus of claim 15, wherein said gate dielectric layer is formed on at least a portion of a substrate, and said substrate substantially comprises one or more of: glass, silicon, silicon dioxide, and/or one or more organic substrate materials, including polyimides (PI), polyethylene terephthalates (PET), polyethersulfones (PES), polycarbonates (PC), polyethylenenaphthalates (PEN), and/or acrylics.

* * * * *